United States Patent
Sato et al.

(10) Patent No.: US 12,078,927 B2
(45) Date of Patent: Sep. 3, 2024

(54) IMPRINT METHOD, IMPRINT APPARATUS, AND ARTICLE MANUFACTURING METHOD

(71) Applicant: CANON KABUSHIKI KAISHA, Tokyo (JP)

(72) Inventors: Kazuhiro Sato, Tochigi (JP); Hiroshi Sato, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/446,597

(22) Filed: Aug. 9, 2023

(65) Prior Publication Data

US 2023/0384666 A1 Nov. 30, 2023

Related U.S. Application Data

(63) Continuation of application No. 17/147,849, filed on Jan. 13, 2021, now Pat. No. 11,768,433.

(30) Foreign Application Priority Data

Jan. 20, 2020 (JP) .................... 2020-007017

(51) Int. Cl.
*G03F 7/00* (2006.01)
*G03F 9/00* (2006.01)

(52) U.S. Cl.
CPC .......... *G03F 7/0002* (2013.01); *G03F 9/7042* (2013.01)

(58) Field of Classification Search
CPC ..... G03F 7/0002; G03F 9/7003; G03F 9/7042
See application file for complete search history.

(56) References Cited

U.S. PATENT DOCUMENTS

| 8,574,479 B2 | 11/2013 | Aoki et al. |
| 9,915,868 B2 | 3/2018 | Sato |

(Continued)

FOREIGN PATENT DOCUMENTS

| JP | 2011061029 A | 3/2011 |
| JP | 2011253839 A | 12/2011 |

(Continued)

OTHER PUBLICATIONS

Office Action issued in U.S. Appl. No. 17/147,849 mailed Jul. 18, 2022.

(Continued)

*Primary Examiner* — James M Mellott
(74) *Attorney, Agent, or Firm* — ROSSI, KIMMS & McDOWELL LLP

(57) ABSTRACT

Provided is an imprint method of performing an imprint process including a contacting step of bringing a mold into contact with an imprint material on a substrate, a curing step of curing the imprint material, and a separating step of separating the mold from the cured imprint material. The method includes acquiring global alignment information, performing a pre-alignment measurement including moving, based on the acquired global alignment information, a second shot region to a measurement position at which a measurement device performs measurement, and measuring a first relative positional shift between the second shot region and the mold using the measurement device, and moving, based on the global alignment information and the measured first relative positional shift, a first shot region to an imprint position at which the imprint process is performed, and starting the contacting step.

8 Claims, 12 Drawing Sheets

(56) References Cited

U.S. PATENT DOCUMENTS

| | | | |
|---|---|---|---|
| 10,416,553 B2 | 9/2019 | Usui | |
| 2004/0072086 A1 | 4/2004 | Noudo | |
| 2011/0290136 A1* | 12/2011 | Koga | B82Y 10/00 |
| | | | 101/481 |
| 2012/0091611 A1 | 4/2012 | Yanagisawa | |

FOREIGN PATENT DOCUMENTS

| | | | |
|---|---|---|---|
| JP | 2012084732 A | 4/2012 | |
| JP | 2013138175 A | 7/2013 | |
| JP | 2016076626 A | 5/2016 | |
| KR | 1020130061065 A | 6/2013 | |
| WO | 2003046963 A1 | 4/2005 | |

OTHER PUBLICATIONS

Office Action issued in U.S. Appl. No. 17/147,849 mailed Feb. 3, 2023.

Notice of Allowance issued in U.S. Appl. No. 17/147,849 mailed May 30, 2023.

* cited by examiner

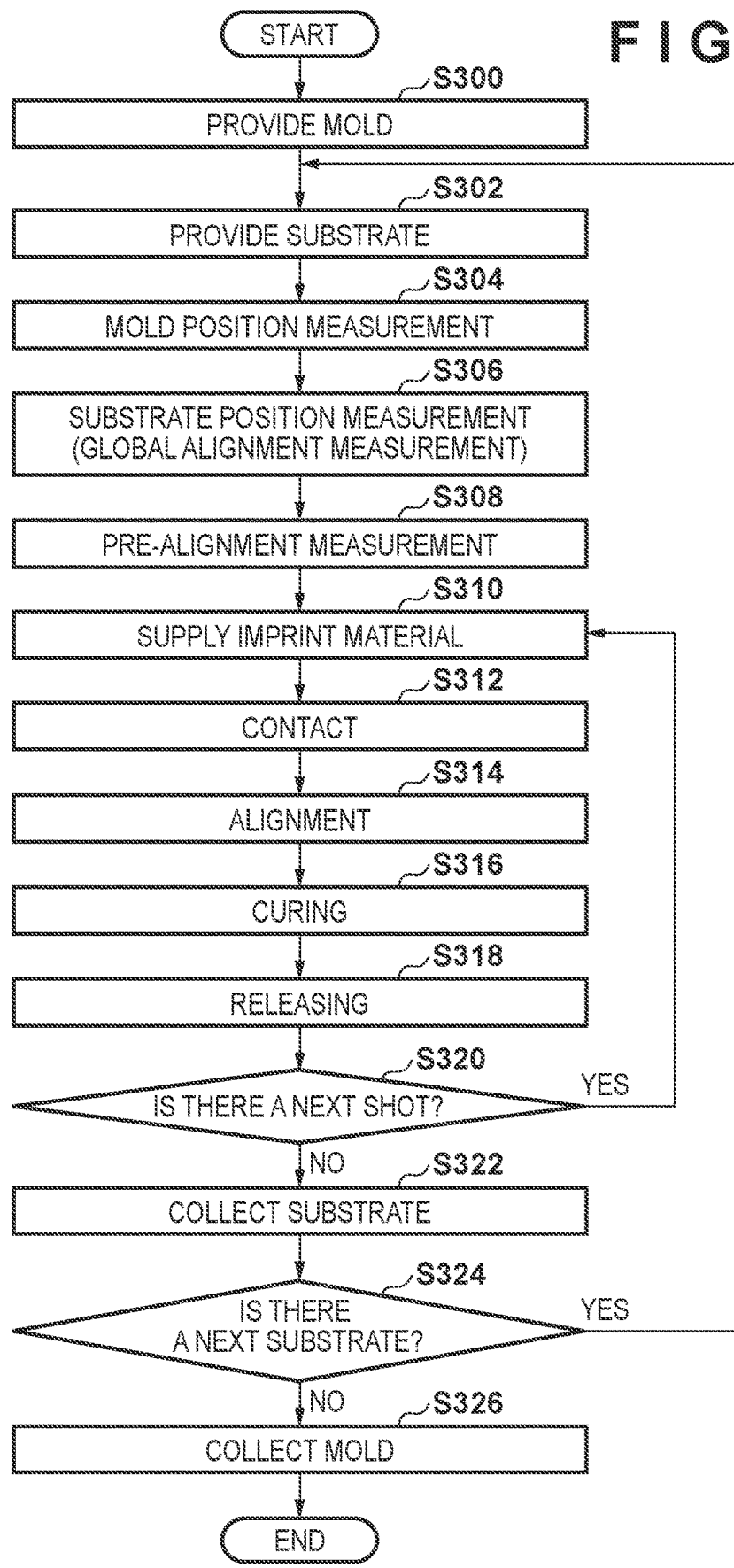

FIG. 9
PRIOR ART
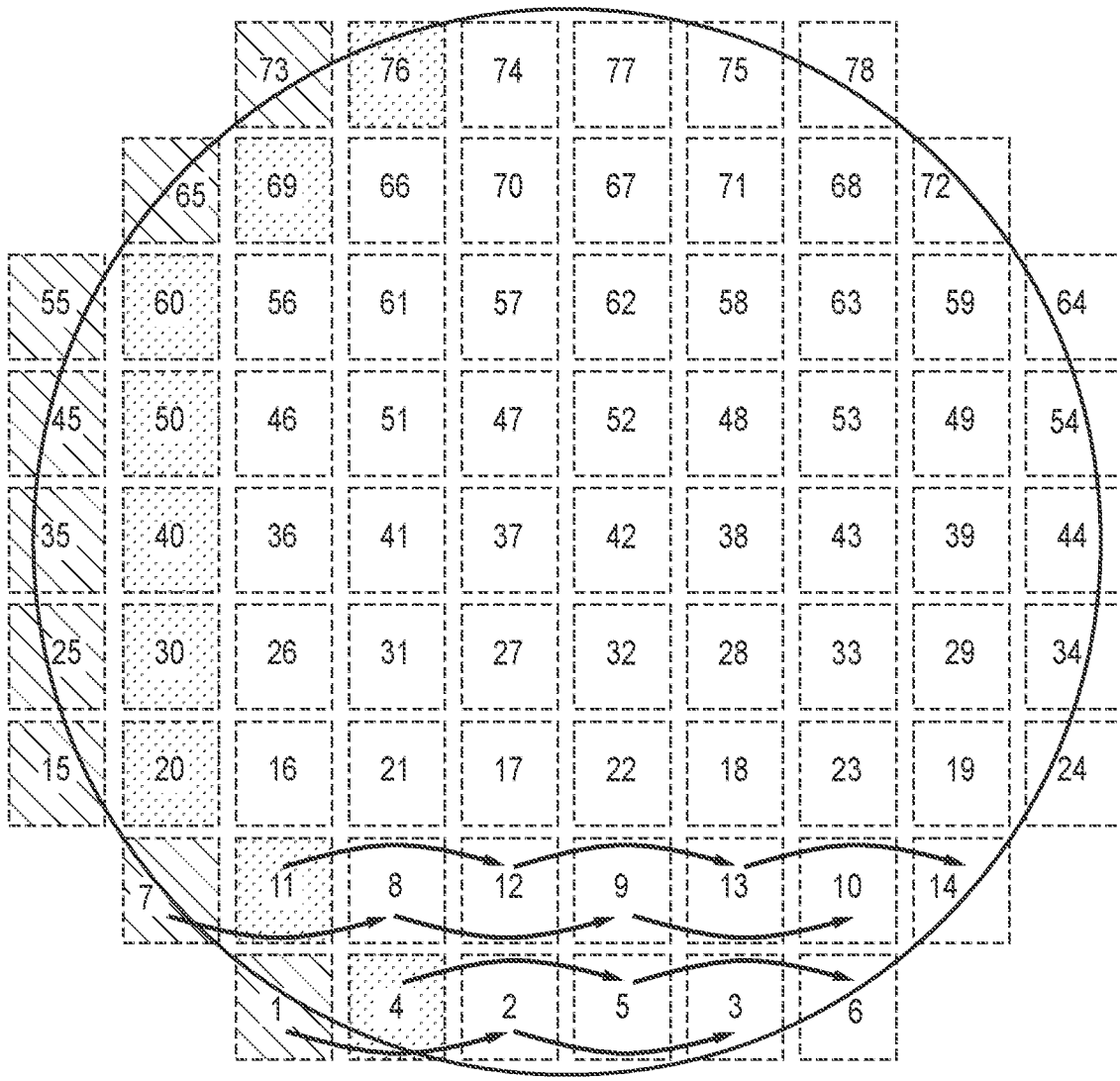
 FIRST PRE-ALIGNMENT SHOT
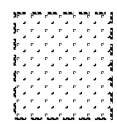 SECOND PRE-ALIGNMENT SHOT

IMPRINT METHOD, IMPRINT APPARATUS, AND ARTICLE MANUFACTURING METHOD

BACKGROUND OF THE INVENTION

Field of the Invention

The present invention relates to an imprint method, an imprint apparatus, and an article manufacturing method.

Description of the Related Art

An imprint apparatus is beginning to be put into practical use as one lithography technique for mass-production of magnetic storage media or semiconductor devices. The imprint apparatus brings a mold with a fine circuit pattern formed into contact with an imprint material on a substrate such as a silicon wafer or glass plate, thereby forming a pattern on the substrate.

For example, in forming a circuit pattern of a semiconductor device, the overlay accuracy between a circuit pattern already formed on a substrate and a circuit pattern to be formed can be very important. As an alignment method in an imprint apparatus, global alignment and die-by-die alignment can be adopted. The global alignment is a method of estimating the positions of all shot regions based on the measurement results of marks in a plurality of sample shot regions on a substrate. The die-by-die alignment is a method of correcting a positional shift between a substrate and a mold by optically detecting a substrate-side mark and a mold-side mark for each shot region.

Japanese Patent Laid-Open No. 2016-076626 describes that coarse alignment (pre-alignment) can be performed after global alignment and before die-by-die alignment. Japanese Patent Laid-Open No. 2012-084732 describes that, as pre-alignment, a mark on a mold and a mark on a wafer are detected in a state in which the mold and a resin applied onto the wafer are not in contact with each other.

Before bringing a mold into contact with an imprint material on a shot region, pre-alignment is performed in the first shot region to be imprinted or every time imprinting is performed. By performing pre-alignment, it is possible to decrease an initial relative positional shift when bringing the mold into contact with the imprint material on the shot region.

However, if an imprint target shot region is a peripheral shot region located in the periphery of the substrate, the overlay accuracy may degrade due to restrictions on the arrangement of marks or a factor that marks are not normally formed by a process in a previous step.

To implement formation of an accurate multilayer circuit pattern, improvement of the overlay accuracy in the imprint technique is an important requirement.

SUMMARY OF THE INVENTION

The present invention provides, for example, an imprint method advantageous in terms of overlay accuracy.

The present invention in its one aspect provides an imprint method of performing an imprint process including a contacting step of bringing a mold into contact with an imprint material supplied onto a substrate, a curing step of curing the imprint material in a state in which the imprint material and the mold are in contact with each other, and a separating step of separating the mold from the cured imprint material. The method comprises acquiring global alignment information including information for specifying position coordinates of each of a plurality of shot regions including a first shot region and a second shot region of the substrate, performing a pre-alignment measurement including moving, based on the acquired global alignment information, the second shot region to a measurement position at which a measurement device performs measurement, and measuring a first relative positional shift between the second shot region and the mold using the measurement device, and moving, based on the global alignment information and the measured first relative positional shift, the first shot region to an imprint position at which the imprint process is performed, and starting the contacting step.

Further features of the present invention will become apparent from the following description of exemplary embodiments (with reference to the attached drawings).

BRIEF DESCRIPTION OF THE DRAWINGS

FIG. 2 is a flowchart of an imprint process;

FIG. 9 is a view for explaining a conventional imprint process by MFD;

DESCRIPTION OF THE EMBODIMENTS

Figure 1:
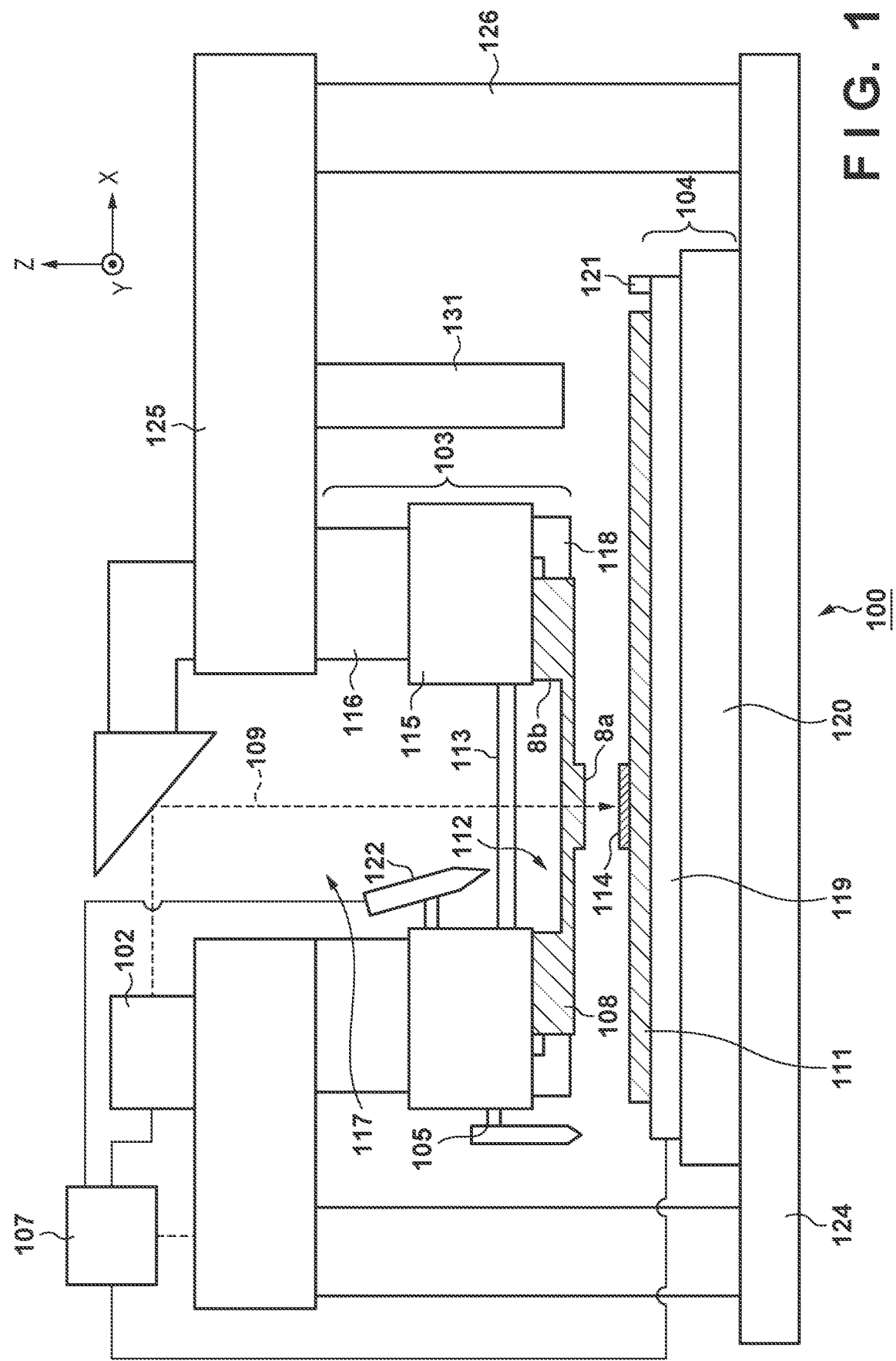
FIG. 1 is a view showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 is a view showing the arrangement of an imprint apparatus 100 according to an embodiment. In this specification and the attached drawings, directions are indicated in an XYZ-coordinate system where the horizontal plane as an XY plane. Generally, a substrate W, which is the object on which a pattern is formed, is placed on a substrate stage 104 so that the surface of the substrate W is parallel to the horizontal plane (XY plane). Therefore, in the following, the directions orthogonal to each other in the plane along the surface of the substrate W are defined as the X-axis and the Y-axis, and the direction orthogonal to the X-axis and the Y-axis is defined as the Z-axis. Further, in the following, the directions parallel to the X-axis, Y-axis, and Z-axis in the XYZ coordinate system are referred to as an X-direction, a Y-direction, and a Z-direction, respectively, and the rotation direction around the X-axis, the rotation direction around the Y-axis, and the rotation direction around the Z-axis are referred to as a θx direction, a θy direction, and a θz direction, respectively.

Firstly, an overview of an imprint apparatus according to an embodiment will be described. The imprint apparatus is an apparatus that brings an imprint material supplied onto a substrate into contact with a mold and supplies curing energy to the imprint material to form a pattern of the cured material to which a concave-convex pattern of the mold is transferred.

As an imprint material, a curable composition (to be sometimes called an uncured resin) that is cured upon application of curing energy is used. As curing energy, electromagnetic waves, heat, or the like can be used. Electromagnetic waves can be, for example, light selected from the wavelength range of 10 nm or more and 1 mm or less, for example, infrared light, visible light, or ultraviolet light, or the like. A curable composition can be a composition that is cured by being irradiated with light or by being heated. Of these compositions, a photo-curable composition that is cured by being irradiated with light contains at least a polymerizable compound and a photopolymerization initiator, and may further contain a non-polymerizable compound or a solvent, as needed. A non-polymerizable compound is at least one type of compound selected from the group consisting of a sensitizer, hydrogen donor, internal mold release agent, surfactant, antioxidant, and polymer component. An imprint material supply apparatus can arrange an imprint material on a substrate in the form of droplets or islands or films formed from a plurality of droplets connected to each other. The viscosity (the viscosity at 25° C.) of the imprint material can be, for example, 1 mPa s or more and 100 mPa s or less. As a material for a substrate, for example, glass, ceramic, metal, semiconductor, or resin can be used. The surface of a substrate may be provided with a member made of a material different from that of the substrate, as needed. For example, a silicon wafer, a compound semiconductor wafer, silica glass, or the like is used as the substrate.

Referring to FIG. 1, the imprint apparatus 100 includes a curing device 102, a mold holder 103, the substrate stage 104, a supply device 105, a controller 107, a TTM measurement device 122, and an off-axis measurement device 131.

The curing device 102 emits light 109 (ultraviolet light) for curing an imprint material in a state in which a mold 108 and the imprint material on a substrate are in contact with each other. The curing device 102 can include a light source (not shown) and an optical element that adjusts the light 109 emitted from the light source to light suitable for imprinting. The imprint material on the substrate is irradiated with the emitted light 109 having passed through the mold 108. Note that in this embodiment, a photocuring method is adopted and thus the curing device 102 is configured to emit the light 109. If, however, a thermal curing method is adopted, the curing device 102 includes a heat source unit for curing an imprint material made of a thermosetting composition.

The mold 108 includes a pattern portion 8a three-dimensionally formed on the first surface facing a substrate 111. In the pattern portion 8a, for example, a concave-convex pattern such as a circuit pattern to be transferred to the substrate is formed. The mold 108 is made of a material such as quartz that can transmit the light 109. The mold 108 can have a shape including, on the opposite side of the first surface, a cavity (concave portion) 8b that makes it easy to deform the mold 108 in the Z direction. For example, the cavity 8b has a circular planar shape when viewed from the Z direction, and has a thickness (depth) that is set in accordance with the size and the material of the mold 108. Alternatively, in an opening region 117 in the mold holder 103, a light transmitting member 113 that sets, as a closed space, a space 112 surrounded by part of the opening region 117 and the cavity 8b can be arranged, and a pressure regulation device (not shown) can control the pressure in the space 112. For example, when bringing the mold 108 into contact with an imprint material 114 on the substrate 111, the pressure regulation device warps the pattern portion 8a into a convex shape toward the substrate 111 by setting the pressure in the space 112 to be higher than that in an external space. This can bring the pattern region 8a into contact with the imprint material 114 from the center of the pattern region 8a. After that, by gradually decreasing the pressure in the space 112, the contact advances from the center of the pattern portion 8a to the peripheral portion. This prevents gas from being trapped between the pattern portion 8a and the imprint material 114, thereby making it possible to fill the entire concave-convex portion of the pattern region 8a with the imprint material 114.

The mold holder 103 also called an imprint head includes a mold chuck 115 that holds the mold 108 by attracting it by a vacuum suction force or an electrostatic force, and a mold driver 116 that moves the mold chuck 115 (that is, the mold 108). The mold chuck 115 and the mold driver 116 have the opening region 117 in the center so that the light 109 emitted from the light source of the curing device 102 is emitted to the substrate 111.

The mold holder 103 further includes a shape correction unit 118 for correcting the shape of the mold 108 (pattern portion 8a) by applying an external force to a plurality of portions on the side surface of the mold 108. The shape correction unit 118 can deform the shape of the mold 108 in accordance with the shape of the pattern already formed on the substrate 111.

The mold driver 116 moves the mold 108 in the Z direction so as to selectively bring the mold 108 into contact with the imprint material 114 on the substrate 111 or separate (release) the mold 108 from the imprint material 114 on the substrate 111. Examples of an actuator that can be adopted for the mold driver 116 are a linear motor and an air cylinder. To cope with accurate positioning of the mold 108, the mold driver 116 may include a plurality of driving systems such as a coarse driving system and a fine driving system. Furthermore, the mold driver 116 may have a position adjustment function not only in the Z direction but also in the X direction, the Y direction, or the θz direction, a tilt function of correcting the tilt of the mold 108, and the like. Note that the contact and releasing operations in the imprint apparatus 100 may be implemented by moving the mold 108 in the Z-axis direction, as described above, but may be implemented by moving the substrate stage 104 in the Z-axis direction or by moving both the mold 108 and the substrate stage 104 relatively.

The substrate stage 104 moves while holding the substrate 111. The substrate stage 104 includes a substrate chuck 119 (substrate holder) that holds the substrate 111 by a suction force and a stage driver 120 that holds the substrate chuck 119 to be movable in the X-Y plane. The substrate chuck 119 can include a plurality of suction portions (not shown) that suck and hold the lower surface of the substrate 111 by a plurality of regions. These suction portions are connected to a pressure regulation device different from the above-described one. Each pressure regulation device generates a suction force by regulating the pressure between the substrate 111 and each suction portion, thereby holding the substrate 111 on the chucking surface. At this time, it is possible to change the pressure value (suction force) individually for each suction portion. Note that the division number of suction portions (the number of arranged suction portions) is not particularly limited, and an arbitrary number is possible. Furthermore, the substrate stage 104 includes a reference mark 121 to be used to align the mold 108 on the surface of the substrate stage 104. The stage driver 120 can adopt, for example, a linear motor as an actuator. The stage driver 120 may include a plurality of driving systems such as a coarse driving system and a fine driving system in each of the X and Y directions. The stage driver 120 may also have a driving system for position adjustment in the Z direction, a position adjustment function of the substrate 111 in the θ direction, or a tilt function of correcting the tilt of the substrate 111. By driving the substrate stage 104, the substrate 111 can be aligned with respect to the mold 108.

The supply device 105 supplies (arranges) the imprint material onto the substrate 111. The supply device 105 includes a discharge nozzle that discharges the imprint material. The amount of the imprint material discharged from the discharge nozzle is decided appropriately based on a desired thickness of the imprint material 114 to be formed on the substrate 111 and the density of a pattern to be formed.

The TTM measurement device 122 is arranged in, for example, the opening region 117, and includes a scope that includes an optical system and an imaging system to measure a positional shift in the X and Y directions between an alignment mark formed on the substrate 111 and that formed on the mold 108. Note that "TTM" is an abbreviation for "Through The Mold", and is intended to observe the mold-side mark and the substrate-side mark via the mold.

On the other hand, the off-axis measurement device 131 includes a scope that includes an optical system and an imaging system to detect the alignment mark formed on the substrate 111 without intervention of the mold 108. The use of the TTM measurement device 122 and the off-axis measurement device 131 makes it possible to relative alignment between the mold 108 and the substrate 111.

Furthermore, the imprint apparatus 100 includes a base surface plate 124 on which the substrate stage 104 is placed, a bridge surface plate 125 that fixes the mold holder 103, and columns 126 that are extended from the base surface plate 124 to support the bridge surface plate 125. The imprint apparatus 100 also includes a mold conveyance mechanism (not shown) that conveys the mold 108 from the outside of the apparatus to the mold holder 103, and a substrate conveyance mechanism (not shown) that conveys the substrate 111 from the outside of the apparatus to the substrate stage 104.

The controller 107 can control the operation, adjustment, and the like of each constituent element of the imprint apparatus 100. The controller 107 can be configured as, for example, a computer including a processor (CPU) and a memory, and can be connected to each constituent element of the imprint apparatus 100 via a line to control each constituent element in accordance with a program. Note that the controller 107 may be formed integrally (in a common housing) with the other parts of the imprint apparatus 100 or may be formed separately (in another housing) from the other parts of the imprint apparatus 100.

[Overview of Imprint Process]

An imprint process (imprint method) of forming a pattern on the substrate by bring the mold 108 into contact with the imprint material 114 on the substrate will be described with reference to FIGS. 2 and 3A to 3C. In step S300, the controller 107 controls the mold conveyance mechanism to convey the mold 108 designated by the lot from a mold stocker to the mold holder 103, and fixes the mold 108 to the mold chuck 115. In step S302, the controller 107 controls the substrate conveyance mechanism to convey the substrate 111 as a processing target from a substrate carrier to the substrate stage 104, and fixes the substrate 111 to the substrate chuck 119.

Next, the controller 107 performs pre-alignment measurement to measure the relative position between the mold 108 and each shot in the substrate 111.

In step S304, the controller 107 causes the TTM measurement device 122 to observe a mold-side mark 63 on the mold 108 and measure its position. Subsequently, the controller 107 causes the TTM measurement device 122 to observe a mark (not shown) on the substrate stage 104 and measure the position of the substrate stage 104 with respect to the TTM measurement device 122.

In step S306, global alignment measurement is performed. In the global alignment measurement, the controller 107 drives the substrate stage 104 so that the substrate 111 is located at a position under the off-axis measurement device 131. After that, the controller 107 uses the off-axis measurement device 131 to measure the positional shifts of marks in a plurality of sample shot regions in the substrate 111 with reference to the substrate stage 104. The positional shift indicates the positional shift of a mark with respect to the measurement position of the off-axis measurement device 131, which is detected when driving, based on design data of a shot array, the substrate stage 104 so that the mark in each sample shot region is located at the measurement position. After that, the controller 107 performs statistical processing such as function fitting and abnormal value processing based on the obtained positional shift in each sample shot region. By performing this statistical processing, global alignment information including information of the positional relationship among the plurality of shot regions to specify the position coordinates of all the shot regions on the substrate 111 is acquired.

Figure 4:
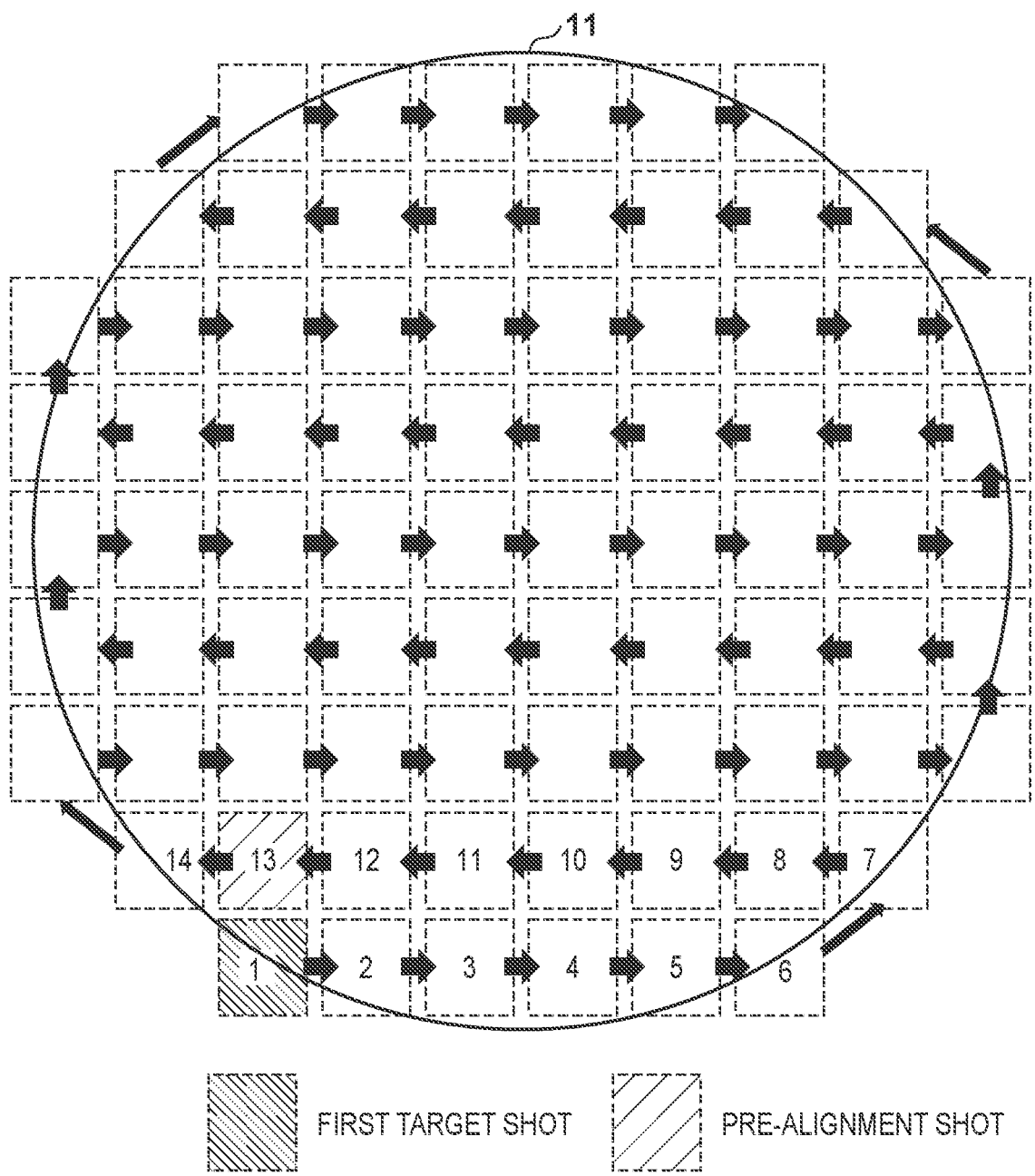
FIG. 4 is a view exemplifying an imprinting order of a plurality of shot regions of a substrate.

The controller 107 designates a shot region that has not been imprinted yet. A region (processed region) to be imprinted in the substrate will be referred to as a "shot region (or simply, shot)" hereinafter. An imprinting order can be, for example, an order of shot 1, shot 2, shot 3, shot 4, . . . , shot 6, shot 7, shot 8, . . . , shot 14, . . . as continuous shot regions on the substrate 111, as shown in FIG. 4. The imprinting order is not limited to this, and an order such as a staggered order or random order can be set. However, the imprinting order of sequentially imprinting the shot regions adjacent to each other, as shown in FIG. 4, is a typical example advantageous in terms of throughput. The shot layout and the imprinting order are saved in advance as a recipe in a memory or the like of the controller 107.

Figure 3A:
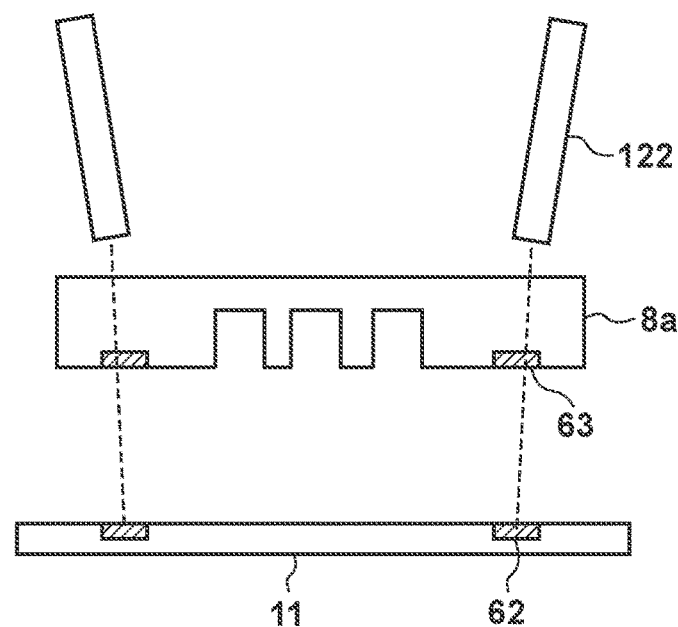
FIGS. 3A to 3C are views for explaining the imprint process.

To align the substrate and the mold more accurately, pre-alignment measurement is executed in step S308. The pre-alignment measurement is performed as follows. Based on the global alignment information acquired in step S306, the controller 107 controls the substrate stage 104 so that the shot region to be imprinted first is located at a measurement position corresponding to an imprint position under the pattern portion 8a of the mold 108. After that, as shown in FIG. 3A, the controller 107 simultaneously observes a substrate-side mark 62 and the mold-side mark 63 using the TTM measurement device 122, and measures the relative positional shift between them.

In step S310, the controller 107 controls the substrate stage 104 so that the target shot region (the shot region to undergo the imprint process) is located at a supply position under the supply device 105, and the supply device 105 supplies the imprint material 114 to the target shot region.

Figure 3B:
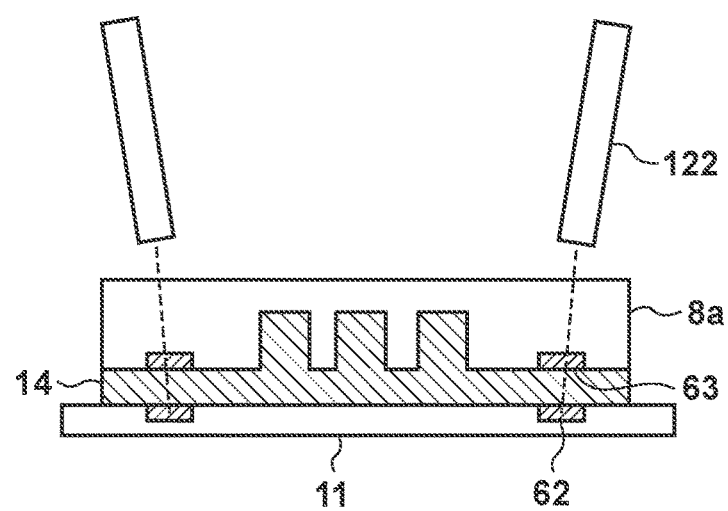

Step S312 is a contact step. In the contact step, the controller 107 first controls the substrate stage 104 so that the target shot region is located at a position (imprint position) under the mold holder 103. At this time, the controller 107 drives the substrate stage 104 based on the global alignment information acquired in step S306 and the relative positional shift obtained by the pre-alignment measurement in step S308. After that, the controller 107 controls the mold holder 103 to drive the mold 108 in the Z direction, thereby bringing the pattern portion 8a of the mold 108 into contact with the imprint material 114 on the target shot region. To prevent bubbles from being generated, the pressure in the space 112 is regulated at the time of contact, as described above. As shown in FIG. 3B, the contact makes the imprint material 114 flow along the concave-convex pattern formed in the pattern portion 8a, and a portion between the substrate 111 and the pattern portion 8a is filled with the imprint material 114.

In step S314, the controller 107 measures the relative positional shift between the substrate-side mark 62 and the mold-side mark 63 using the TTM measurement device 122, and controls the substrate stage 104 and the shape correction unit 118 so that the relative positional shift amount falls within a predetermined tolerance. Thus, the pattern portion 8a of the mold 108 and the target shot region are aligned. This alignment is performed for each shot region, and is called die-by-die alignment.

Figure 3C:
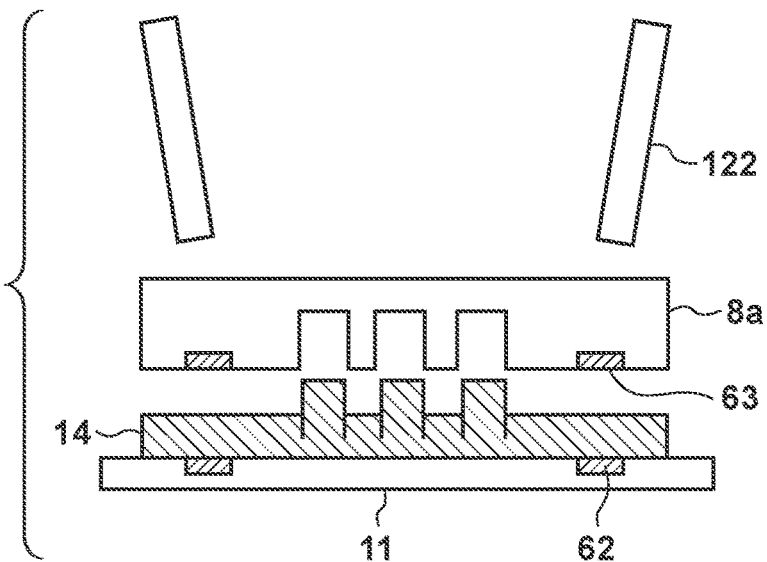

In step S316, in a state in which the mold 108 and the imprint material 114 are in contact with each other, the controller 107 causes the curing device 102 to emit the light 109 to cure the imprint material (curing step). After the imprint material 114 is cured, the controller 107 controls, in step S318, the mold holder 103 to separate the mold 108 from the cured imprint material 114 (releasing step), as shown in FIG. 3C.

In step S320, the controller 107 determines whether there is a shot region to be processed next. If there is a shot region to be processed next, the process returns to step S310, and the imprint process of the next shot region is performed. In the imprint process of the next shot region, the shot region is moved from the supply position of the imprint material to a position under the mold holder 103 for the contact step in step S312. At this time as well, the substrate stage 104 is driven based on the global alignment information acquired in step S306 and the relative positional shift obtained by the pre-alignment measurement in step S308. If it is determined in step S320 that there is no shot region to be processed next, the process advances to step S322. In this way, the imprint process is performed for all the shot regions designated by the lot, thereby forming the pattern on the entire surface of the substrate 111.

In step S322, the controller 107 controls the substrate conveyance mechanism to collect the substrate 111 placed on the substrate chuck 119 and having undergone the imprint process. In step S324, the controller 107 determines whether there is a substrate to be processed next. If there is a substrate to be processed next, the process returns to step S302, and the imprint process is performed for the next substrate. If there is no substrate to be processed next, the process shifts to step S326. In step S326, the controller 107 controls the mold conveyance mechanism to collect the mold 108 held by the mold chuck 115.

[Improvement of Pre-Alignment Measurement]

The die-by-die alignment executed in step S314 aligns the target shot region and the pattern portion 8a of the mold 108. Since, during the die-by-die alignment, the mold 108 is in contact with the imprint material 114 on the substrate 111, an alignment amount is limited, and it takes time to perform alignment. Therefore, it is necessary to decrease the alignment amount between the substrate 111 and the mold 108 during the die-by-die alignment. The pre-alignment measurement in step S308 performed before bringing the mold 108 into contact with the imprint material 114 on the substrate 111 influences the alignment amount between the substrate 111 and the mold 108 during the die-by-die alignment. Improved pre-alignment measurement will be described below.

As described above, in the example shown in FIG. 4, the continuous shot regions shot 1, shot 2, shot 3, shot 4, . . . , shot 6, shot 7, shot 8, . . . , shot 14, . . . on the substrate 111 are imprinted in this order. These shot regions include "peripheral shot regions" located in the peripheral portion of the substrate 111. The peripheral shot regions are also called partial fields (PFs). Shot regions other than the peripheral shot regions are called full shot regions or full fields (FFs). To maximize the effective area (the area of a region to which the pattern is transferred) of the substrate 111, the imprint process can also be performed for the peripheral shot regions.

Figure 5:
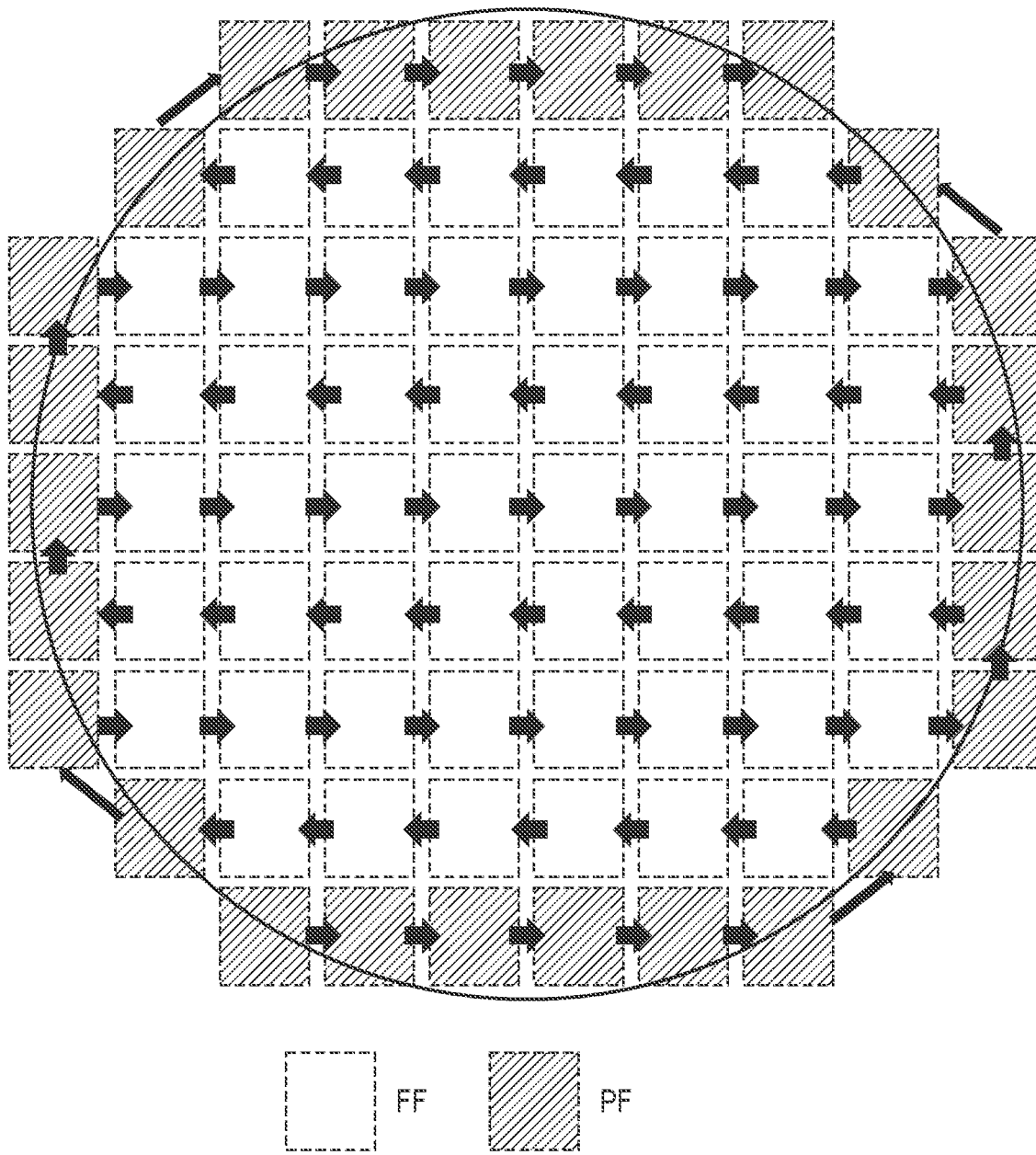
FIG. 5 is a view showing an example of classification of peripheral shot regions and full shot regions.

FIG. 5 is a view showing an example of classification of the peripheral shot regions (PFs) and the full shot regions (FFs). Each "peripheral shot region" typically includes a "partial shot region" where part of the pattern portion 8a of the mold 108 partially protrudes from the peripheral portion (periphery) of the substrate 111 when bringing the mold 108 into contact with the imprint material on the substrate 111 and only part of the pattern portion 8a is transferred. A shot region that has no "omission" but has a corner only contacting the peripheral portion of the substrate or a shot region at a position near the peripheral portion of the substrate can be classified as a peripheral shot region. For example, since a region a predetermined distance (for example, 3 mm) away from the periphery of the substrate is readily influenced by a process in a previous step, it can be regarded as an invalid area that is not targeted by the imprint process. A shot region partially overlapping the invalid area may also be classified as a peripheral shot region.

Figure 6:
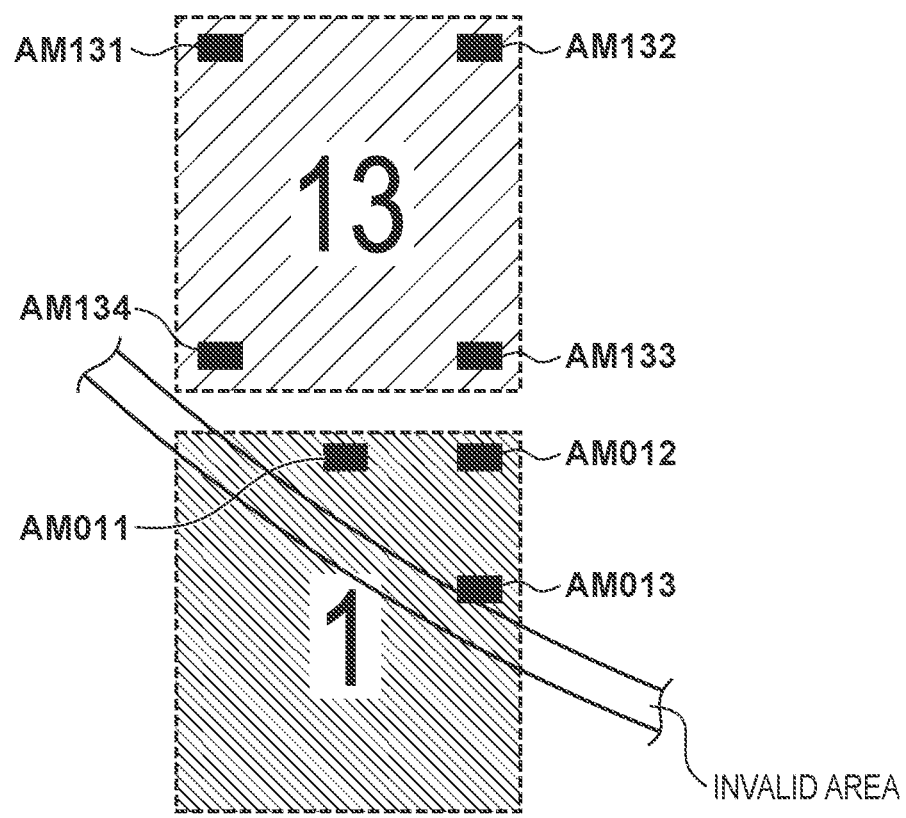
FIG. 6 is a view showing examples of the mark arrangements of the peripheral shot region and the full shot region.

As shown in FIG. 6, the PF is smaller in area than the FF, and is thus restricted in terms of the degree of freedom of the arrangement of marks, as compared with the FF. For example, while marks (AM131, AM132, AM133, and AM134) can be arranged at four corners in the FF, at most three marks (AM011, AM012, and AM013) can be arranged at a narrow interval in the PF. Therefore, in the PF, the averaging effect when calculating translation components by performing statistical processing for each mark becomes small, thereby degrading the accuracy. In the PF, since the arrangement of the marks (the distance between the marks) is restricted, the span between the mark and the scope also becomes short. This may increase a correction error of a rotation component or the like. In addition, the possibility that a mark is not normally formed by the process in the previous step is higher in the PF than in the FF. For example, the mark AM013 is located near the invalid area in the periphery of the substrate. The mark at this position may not be formed normally. If pre-alignment measurement is performed using the mark not formed normally, the alignment accuracy degrades, thereby increasing the alignment amount during the die-by-die alignment.

In this embodiment, not the target shot region but the FF geometrically nearest to the target shot region is used as the shot region for which the pre-alignment measurement in step S308 is executed. In the example shown in FIG. 4, shot 1 (the first shot region) that is imprinted first is the PF. According to this embodiment, if shot 1 is the target shot region, not shot 1 but shot 13 (second shot region) as the FF geometrically nearest to shot 1 is selected as the shot region for which the pre-alignment measurement in step S308 is executed. The geometrically nearest shot region indicates, for example, a shot region having a shortest distance between shot centers. Note that the relationship between the first shot region and the second shot region is not always limited to the relationship between the PF and the FF, and may be a relationship that can sufficiently obtain the effect in terms of the productivity and the accuracy of the pre-alignment measurement.

Figure 7:
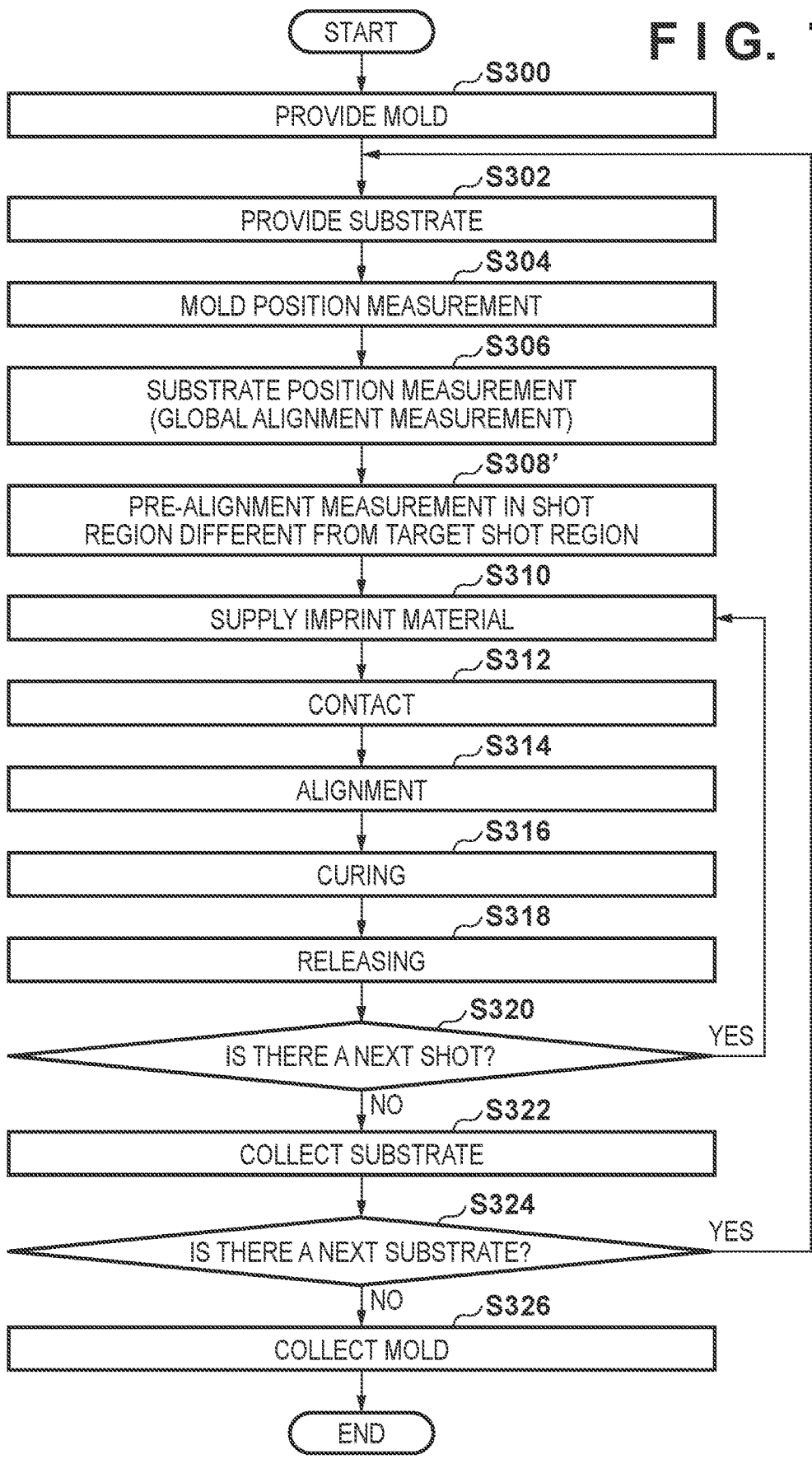
FIG. 7 is a flowchart of the imprint process.

FIG. 7 is a flowchart of the imprint process according to this embodiment. This flowchart is mostly the same as that shown in FIG. 2 except that step S308' is executed as pre-alignment measurement instead of step S308. In step S308', pre-alignment measurement is performed for a shot region different from the target shot region. For example, as described above, if shot 1 is the target shot region, the pre-alignment measurement is performed for not shot 1 but shot 13 as the FF geometrically nearest to shot 1. More specifically, based on the global alignment information acquired in step S306, the controller 107 controls the substrate stage 104 so that shot 13 is located at a measurement position corresponding to an imprint position under the pattern portion 8a of the mold 108. After that, the controller 107 simultaneously observes the substrate-side mark 62 and the mold-side mark 63 using the TTM measurement device 122, and measures the relative positional shift between them.

Then, in step S310, the controller 107 controls the substrate stage 104 so that shot 1 as the target shot region is located at the supply position under the supply device 105, and the supply device 105 supplies the imprint material 114 to shot 1. In step S312, the controller 107 controls the substrate stage 104 so that shot 1 is located at the position (imprint position) under the mold holder 103. At this time, the controller 107 drives the substrate stage 104 based on the global alignment information acquired in step S306 and the result obtained by the pre-alignment measurement (that is, the pre-alignment measurement for shot 13) in step S308'.

After that, the controller 107 controls the mold holder 103 to drive the mold 108 in the Z direction, thereby bringing the pattern portion 8a of the mold 108 into contact with the imprint material 114 on shot 1 as the target shot region. In the imprint process of shot 2 and subsequent shot regions as well, the substrate stage 104 is driven based on the global alignment information acquired in step S306 and the result obtained by the pre-alignment measurement for shot 13 in step S308'.

The above-described example has explained that the substrate stage is driven to the next shot position based on the pre-alignment measurement result of shot 13. The present invention, however, is not limited to this. For example, the target position of the substrate stage may be corrected based on the measurement value of the TTM measurement device 122 during the die-by-die alignment in addition to the pre-alignment measurement result. More specifically, the substrate stage 104 is driven using, as a correction amount, the positional shift measurement value at the start of the die-by-die alignment. Furthermore, after imprinting a plurality of shot regions, statistical processing may be performed for the positional shift measurement value at the start of the die-by-die alignment, and the position of the substrate stage may then be corrected based on the result of the statistical processing. This can further decrease the alignment amount during the die-by-die alignment.

As described above, according to this embodiment, if the target shot region is restricted in terms of the arrangement of the marks and the formation accuracy like the PF, pre-alignment measurement is executed for the FF (for example, shot 13) near the target shot region. Therefore, this is hardly influenced by the restrictions on the arrangement of the substrate-side mark 62 measured by the TTM measurement device 122 or the problem that the substrate-side mark 62 is not formed normally by the process in the previous step. As a result, the alignment amount between the substrate 111 and the mold 108 in the die-by-die alignment can be made small.

Note that this embodiment has explained a case in which pre-alignment measurement is executed only for shot 1 as the first target shot region. However, pre-alignment measurement may be executed for each shot region or executed at an interval of a predetermined number of shot regions, which is equal to or larger than two and is smaller than the total number of shot regions, for example, when the column or row of the shot region is changed. If pre-alignment measurement is executed for each shot region, it is executed before supplying the imprint material to the target shot region, and after supplying the imprint material, the substrate stage is driven based on the pre-alignment measurement result. At this time, if the target shot region is the PF, the shot region (FF) which has not been imprinted and is geometrically nearest to the target shot region is selected as a shot region for pre-alignment measurement. The same applies to a case in which pre-alignment measurement is executed at an interval of the number of shot regions, which is equal to or larger than two and is smaller than the total number of shot regions.

Furthermore, an imprint material discharge method different from the inkjet method may be used and the above-described imprint process may be executed for a substrate on which the imprint material has been arranged. In this case, the imprint material supply step in step S310 of FIG. 7 is eliminated, and step S312 is executed immediately after the pre-alignment measurement in step S308'.

(Modification)

Figure 8:
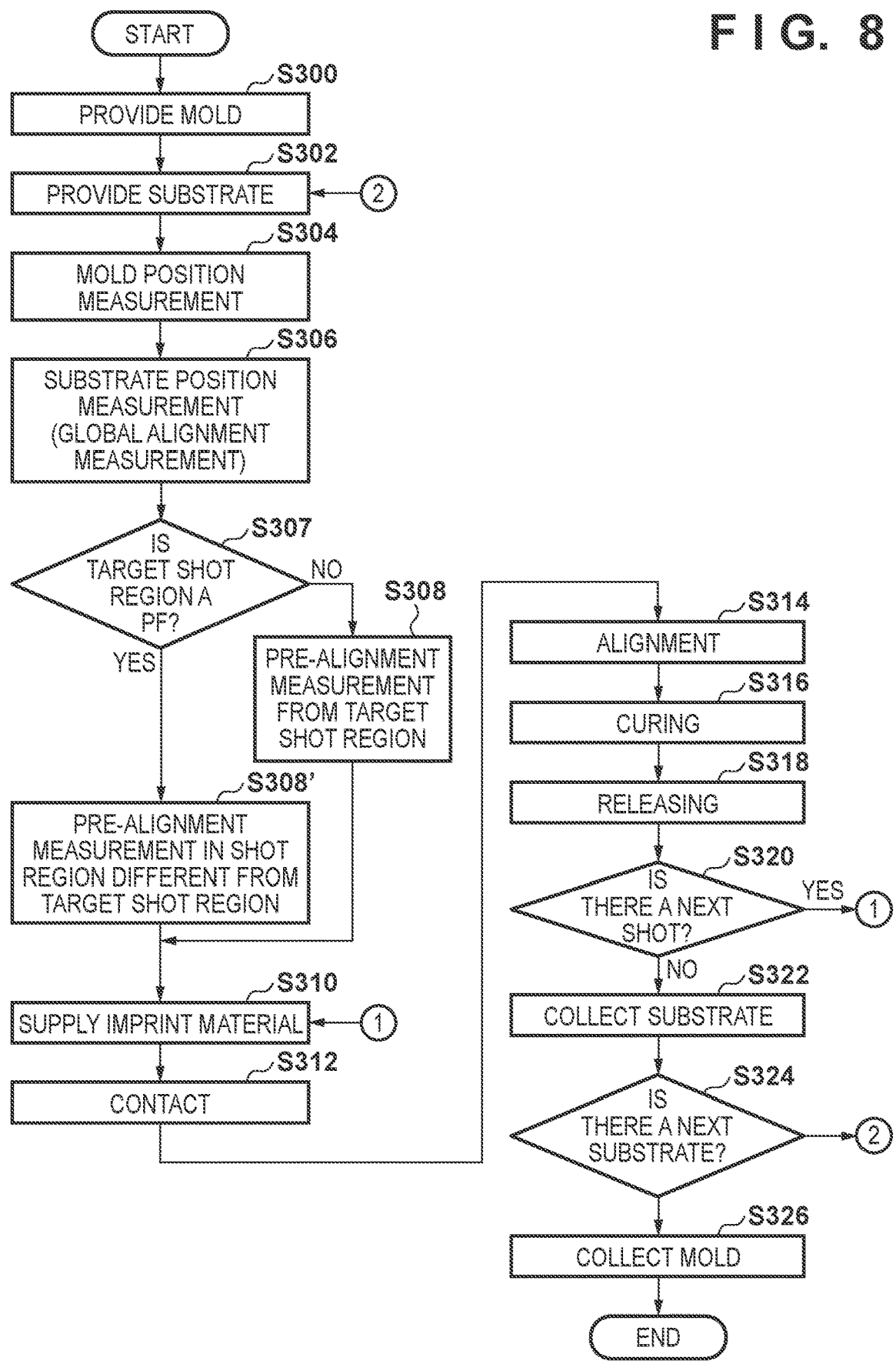
FIG. 8 is a flowchart of the imprint process.

FIG. 8 is a flowchart according to a modification of FIG. 7. Referring to FIG. 8, upon completion of the global alignment in step S306, the controller 107 determines, in step S307, with reference to, for example, the shot layout stored as a recipe in the memory, whether the target shot region is the PF. Alternatively, the recipe may include in advance, for each shot region, information indicating whether the shot region is the FF or PF. If the target shot region is the PF, the process shifts to step S308', as in FIG. 7, and the pre-alignment measurement is performed for the FF that is different from the target shot region and is near the target shot region. On the other hand, if the target shot region is not the PF but the FF, it is unnecessary to use information of another shot region, and thus the process shifts to step S308, as in FIG. 2, to perform the pre-alignment measurement for the target shot region.

As described above, according to this embodiment, it is possible to decrease the alignment amount during the die-by-die alignment. Even if the imprint process is repeatedly performed, it is possible to form the pattern while satisfactorily maintaining the overlay accuracy without decreasing the productivity.

Second Embodiment

The first embodiment has described the imprint process as SFD (Single Field Dispense). However, this embodiment performs an imprint process by MFD (Multi Field Dispense). In SFD, as described in the first embodiment, a sequence of supply of the imprint material, contact, curing, and releasing is performed for each shot region. To the contrary, in MFD, an imprint material is successively supplied to two or more shot regions, and then a sequence of contact, curing, and releasing is performed for each of the shot regions to which the imprint material has been supplied. Since the driving amount of the substrate stage is smaller in MFD than in SFD that performs an operation of supplying the imprint material to each shot region, it is possible to improve the productivity. FIG. 9 shows an example of the imprint process when MFD is performed. In MFD, the imprint material is successively supplied to two or more shot regions, and then contact and curing are performed for each shot region. Therefore, exposure light for curing may influence the imprint material arranged in an adjacent shot region. To relax the influence, contact, curing, and releasing are performed for every other shot region in the example shown in FIG. 9.

A conventional imprint process by MFD will be described first. In the conventional imprint process, pre-alignment measurement is performed for shot 1 (first pre-alignment shot) as the first target shot region in the shot region row. With respect to shot 1, a TTM measurement device 122 is used to simultaneously observe a substrate-side mark 62 and a mold-side mark 63, and measure a positional shift. After the measurement, a substrate stage 104 moves to a position under a supply device 105. After that, a controller 107 controls the substrate stage 104 and the supply device 105 to successively supply an imprint material 114 to shot 1, shot 2, and shot 3 as every other shot regions on a substrate 111. Next, the substrate stage 104 is driven to arrange shot 1, to which the imprint material 114 has been supplied, at a predetermined position (imprint position) under a mold holder 103. At this time, the substrate stage 104 is driven based on global alignment information and the result of pre-alignment measurement for shot 1. The mold holder 103 drives a mold 108 in the Z direction to bring a pattern portion 8a of the mold 108 into contact with the imprint material 114 on shot 1, thereby performing die-by-die alignment. After that, the imprint material 114 is cured and released, thereby ending the imprint process for shot 1.

Subsequently, the substrate stage 104 is driven to arrange shot 2 at the imprint position under the mold holder 103. At this time, the substrate stage 104 is driven based on the global alignment information and the result of the pre-alignment measurement for shot 1. After that, die-by-die alignment, curing, and releasing are performed, thereby ending the imprint process for shot 2. The imprint process is also executed for shot 3 in the same manner.

After that, pre-alignment measurement is executed again for shot 4 (second pre-alignment shot) between shot 1 and shot 2. With respect to shot 4, the TTM measurement device 122 is used to simultaneously observe the substrate-side mark 62 and the mold-side mark 63, and measure a positional shift. After the measurement, the substrate stage 104 moves to a position under the supply device 105. After that, the controller 107 controls the substrate stage 104 and the supply device 105 to successively supply the imprint material 114 to shot 4, shot 5, and shot 6 as every other shot regions on the substrate 111. Next, the substrate stage 104 is driven to arrange shot 4, to which the imprint material 114 has been supplied, at the imprint position under the mold holder 103. At this time, the substrate stage 104 is driven based on the global alignment information and the result of the pre-alignment measurement for shot 4. The mold holder 103 drives the mold 108 in the Z direction to bring the pattern portion 8a of the mold 108 into contact with the imprint material 114 on shot 4, thereby performing die-by-die alignment. After that, the imprint material 114 is cured and released, thereby ending the imprint process for shot 4.

Subsequently, the substrate stage 104 is driven to arrange shot 5 at the imprint position under the mold holder 103. At this time, the substrate stage 104 is driven based on the global alignment information and the result of the pre-alignment measurement for shot 4. After that, die-by-die alignment, curing, and releasing are performed, thereby ending the imprint process for shot 5. The imprint process is also executed for shot 6 in the same manner.

Then, every time a new shot region row starts, pre-alignment is performed for the first pre-alignment shot and the second pre-alignment shot. In this conventional example, since pre-alignment is performed for a PF, the accuracy of the pre-alignment may degrade.

Figure 10:
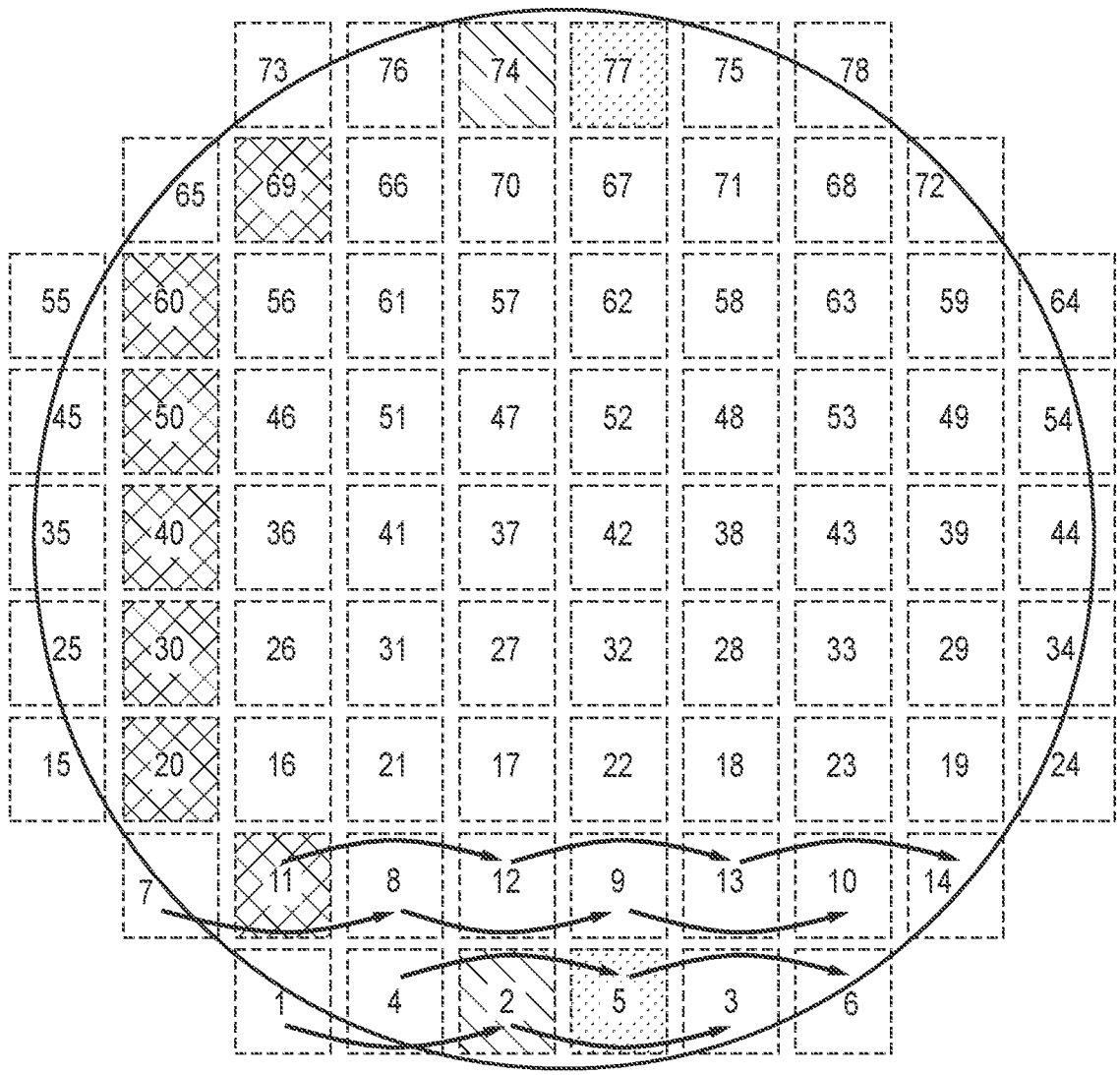
FIG. 10 is a view for explaining an imprint process by MFD.

An imprint process by MFD according to this embodiment will be described next with reference to FIG. 10. In the imprint process according to this embodiment, the first pre-alignment is performed for shot 2. With respect to shot 2, the TTM measurement device 122 is used to simultaneously observe the substrate-side mark 62 and the mold-side mark 63, and measure a positional shift. After the measurement, the substrate stage 104 moves to a position under the supply device 105. After that, the controller 107 controls the substrate stage 104 and the supply device 105 to successively supply the imprint material 114 to shot 1, shot 2, and shot 3 as every other shot regions on the substrate 111. Next, the substrate stage 104 is driven to arrange shot 1, to which the imprint material 114 has been supplied, at the imprint position under the mold holder 103. At this time, the substrate stage 104 is driven based on global alignment information and the result of the pre-alignment measurement for shot 2. The mold holder 103 drives the mold 108 in the Z direction to bring the pattern portion 8a of the mold 108 into contact with the imprint material 114 on shot 1, thereby performing die-by-die alignment. After that, the imprint material 114 is cured and released, thereby ending the imprint process for shot 1.

Subsequently, the substrate stage 104 is driven to arrange shot 2 at the imprint position under the mold holder 103. At this time, the substrate stage 104 is driven based on the global alignment information and the result of the pre-alignment measurement for shot 2. After that, die-by-die alignment, curing, and releasing are performed, thereby ending the imprint process for shot 2. The imprint process is also executed for shot 3 in the same manner.

After that, pre-alignment measurement is executed again for shot 5 as the second pre-alignment shot. With respect to shot 5, the TTM measurement device 122 is used to simultaneously observe the substrate-side mark 62 and the mold-side mark 63, and a positional shift is measured. After the measurement, the substrate stage 104 moves to the position under the supply device 105. After that, the controller 107 controls the substrate stage 104 and the supply device 105 to successively supply the imprint material 114 to shot 4, shot 5, and shot 6 as every other shot regions on the substrate 111.

Next, the substrate stage 104 is driven to arrange shot 4, to which the imprint material 114 has been supplied, at the imprint position under the mold holder 103. At this time, the substrate stage 104 is driven based on the global alignment information and the result of the pre-alignment measurement for shot 5. The mold holder 103 drives the mold 108 in the Z direction to bring the pattern portion 8a of the mold 108 into contact with the imprint material 114 on shot 4, thereby performing die-by-die alignment. After that, the imprint material 114 is cured and released, thereby ending the imprint process for shot 4.

Subsequently, the substrate stage 104 is driven to arrange shot 5 at the imprint position under the mold holder 103. At this time, the substrate stage 104 is driven based on the global alignment information and the result of the pre-alignment measurement for shot 5. After that, die-by-die alignment, curing, and releasing are performed, thereby ending the imprint process for shot 5. The imprint process is also executed for shot 6 in the same manner.

Subsequently, a new shot region row starts, and pre-alignment measurement is performed for shot 11 as the first pre-alignment shot. After a positional shift is measured with respect to shot 11, the substrate stage 104 moves to the position under the supply device 105. After that, the controller 107 controls the substrate stage 104 and the supply device 105 to successively supply the imprint material 114 to shot 7, shot 8, shot 9, and shot 10 as every other shot regions on the substrate 111. Next, the substrate stage 104 is driven to arrange shot 7, to which the imprint material 114 has been supplied, at the imprint position under the mold holder 103. At this time, the substrate stage 104 is driven based on the global alignment information and the result of the pre-alignment measurement for shot 11. The mold holder 103 drives the mold 108 in the Z direction to bring the pattern portion 8a of the mold 108 into contact with the imprint material 114 on shot 7, thereby performing die-by-die alignment. After that, the imprint material 114 is cured and released, thereby ending the imprint process for shot 7.

Subsequently, the substrate stage 104 is driven to arrange shot 8 at the imprint position under the mold holder 103. At this time, the substrate stage 104 is driven based on the global alignment information and the result of the pre-alignment measurement for shot 11. After that, die-by-die alignment, curing, and releasing are performed, thereby ending the imprint process for shot 8. The imprint process is also executed for each of shot 9 and shot 10 in the same manner.

Subsequently, pre-alignment measurement is executed again for shot 11 as the second pre-alignment shot. The imprint process is executed for each of shot 11, shot 12, shot 13, and shot 14 in the same manner. Then, every time a new shot region row starts, the pre-alignment measurement is performed by selecting the first pre-alignment shot and the second pre-alignment shot.

Note that in the example shown in FIG. 5 according to the first embodiment, shot 74 and shot 77 are defined as PFs. Even for the PF, the area may be large and it may be possible to ensure the required accuracy of pre-alignment measurement. In this case, for example, as shown in FIG. 10, shot 74 can be used as the first pre-alignment shot and shot 77 can be used as the second pre-alignment shot. When imprinting a row including shot regions from shot 73 to shot 78, there is no FF for which no imprint process has been performed (because shot 74 and shot 77 are defined as PFs). However, when shot regions, like shot 74 and shot 77, whose areas are larger than those of shot 73 and shot 76 are used, the accuracy of pre-alignment measurement can be improved.

This embodiment has explained the case in which pre-alignment measurement is performed for shot 2, and the imprint process is performed for shot 1, shot 2, and shot 3 in this order. The present invention, however, is not limited to this. For example, after pre-alignment measurement is executed for shot 2, the imprint process may be executed for shot 2, shot 1, and shot 3 in this order.

Third Embodiment

The third embodiment will describe a pre-alignment shot selection method. As described in the first embodiment, the imprint apparatus individually measures the positions of the substrate 111 and the mold 108 with reference to the apparatus coordinates using the off-axis measurement device 131 and the TTM measurement device 122. The TTM measurement device 122 measures the position of the mold 108 with reference to the position of the TTM measurement device 122 by observing the mold-side mark 63. On the other hand, the substrate stage 104 that holds the substrate 111 moves to a position under the off-axis measurement device 131, and performs global alignment measurement for estimating the position coordinates of all the shot regions on the substrate 111 using the off-axis measurement device 131. In the global alignment measurement, the off-axis measurement device 131 is used to measure the marks in the plurality of sample shot regions on the substrate 111, thereby measuring the position of each sample shot region in the substrate 111 with reference to the substrate stage 104. After the global alignment measurement, the above-described pre-alignment measurement is executed for the designated shot region.

Figure 11:
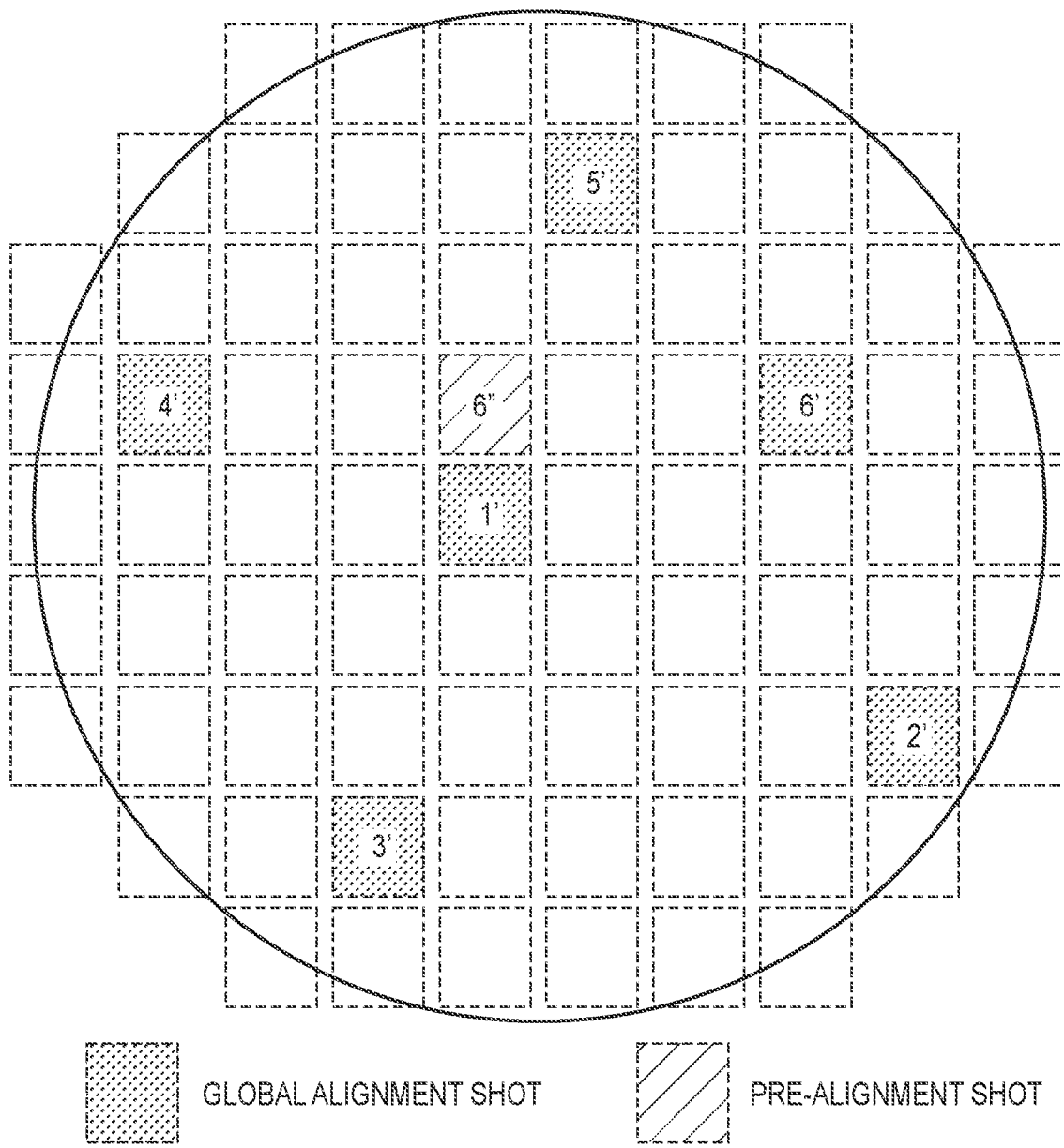
FIG. 11 is a view for explaining measurement of a pre-alignment shot during global alignment.

FIG. 11 shows an example of this embodiment. In global alignment measurement, a controller 107 drives a substrate stage 104 so as to sequentially send sample shot regions shot 1' to shot 6' to the measurement position (first measurement position) of an off-axis measurement device 131. After that, the off-axis measurement device 131 is used to measure a mark in each sample shot region. At this time, when the off-axis measurement device 131 measures shot 6', shot 6" is located near a measurement position (second measurement position) at which a TTM measurement device 122 performs measurement. The controller 107 thus selects shot 6" as a pre-alignment shot. After the off-axis measurement device 131 measures shot 6', the controller 107 moves shot 6" selected as the pre-alignment shot to the measurement position at which the TTM measurement device 122 performs measurement. After that, the TTM measurement device 122 is used to measure shot 6" as the pre-alignment shot. This can shorten the driving distance of the substrate stage, thereby improving the productivity.

<Embodiment of Article Manufacturing Method>

A pattern of a cured material formed by using an imprint apparatus is used permanently for at least some of various articles, or is used temporarily when manufacturing various articles. The articles include an electric circuit element, an optical element, a MEMS, a recording element, a sensor, and a mold. Examples of the electric circuit element are a volatile or nonvolatile semiconductor memory such as a DRAM, an SRAM, a flash memory, or an MRAM and a semiconductor element such as an LSI, a CCD, an image sensor, or an FPGA. An example of the mold is an imprinting mold.

The pattern of a cured material is used unchanged as a constituent member for at least some of the foregoing articles, or is temporarily used as a resist mask. The resist mask is removed after etching, ion implantation, or the like is performed in a substrate processing step.

Next, the article manufacturing method will be described. In step SA of FIG. 12, a substrate 1z which is a silicon substrate or the like on whose surface a processing target material 2z such as an insulator is formed is prepared, and next, an imprint material 3z is applied to the surface of the processing target material 2z by an ink-jet method. A state in which the imprint material 3z in the form of a plurality of droplets is applied onto the substrate is shown here.

Figure 12:
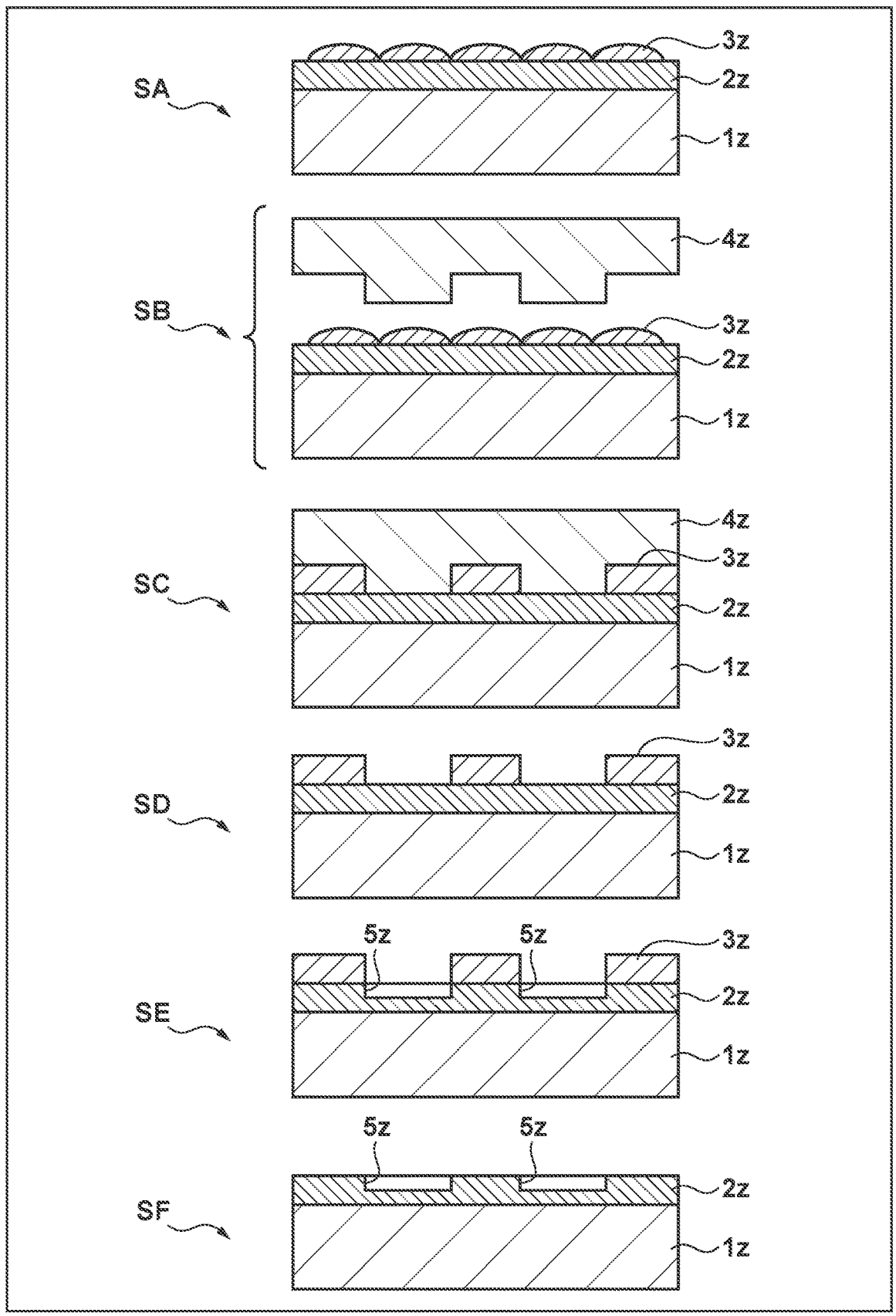
FIG. 12 is a view for explaining an article manufacturing method according to an embodiment.

As shown in step SB of FIG. 12, a side of an imprinting mold 4z on which its three-dimensional pattern is formed faces the imprint material 3z on the substrate. In step SC of FIG. 12, the substrate 1z to which the imprint material 3z has been applied and the mold 4z are brought into contact, and pressure is applied. Gaps between the mold 4z and the processing target material 2z is filled with the imprint material 3z. When the imprint material 3z is irradiated with light as curing energy through the mold 4z in this state, the imprint material 3z is cured.

In step SD of FIG. 12, when the mold 4z and the substrate 1z are separated after the imprint material 3z is cured, a pattern of the cured material of the imprint material 3z is formed on the substrate 1z. The pattern of this cured product has a shape such that the concave portion of the mold corresponds to the convex portion of the cured product, and the convex portion of the mold corresponds to the concave portion of the cured product; that is, the three-dimensional pattern of the mold 4z is transferred to the imprint material 3z.

In step SE of FIG. 12, when the pattern of the cured material is etched as an etching resistant mask, portions out of the surface of the processing target material 2z where the cured material is not present or thinly remains are removed, and grooves 5z are achieved. In step SF of FIG. 12, when the pattern of the cured material is removed, it is possible to achieve an article in which the grooves 5z are formed on the surface of the processing target material 2z. The pattern of the cured product is removed here; however, the pattern of the cured product may be used as, for example, an interlayer dielectric film included in the semiconductor element or the like, that is, the constituent member of the article without removing it after processing.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-007017, filed Jan. 20, 2020, which is hereby incorporated by reference herein in its entirety.

What is claimed is:

1. An imprint method of performing an imprint process including a contacting step of bringing a mold into contact with an imprint material supplied onto a substrate, a curing step of curing the imprint material in a state in which the imprint material and the mold are in contact with each other, and a separating step of separating the mold from the cured imprint material, the method comprising:

performing a global alignment measurement on two or more shot regions of a plurality of shot regions to acquire global alignment information including information for specifying position coordinates of each of a plurality of shot regions including a first shot region, which is a peripheral shot region having a partial field where a portion of a pattern of the mold is transferred to the substrate, and a second shot region of the substrate, which is a non-peripheral shot region having a full field where all of the pattern of the mold is transferred to the substrate;

moving, based on the acquired global alignment information, the second shot region to a measurement position at which a measurement device performs measurement, and performing a pre-alignment measurement to acquire a local first relative positional shift between the second shot region and the mold using the measurement device; and moving, based on both the global alignment information and the measured local first relative positional shift of the second shot region that is different from the first shot region and is near the first shot region, the first shot region to an imprint position at which the imprint process is performed, and starting the contacting step.

2. The method according to claim 1, further comprising measuring a local second relative positional shift between the first shot region and the mold in a state in which the mold and the imprint material on the first shot region are in contact with each other by the contacting step, and aligning the first shot region and the mold based on the measured local second positional shift.

3. The method according to claim 1, further comprising a supplying step of moving the first shot region to a supply position of the imprint material after the pre-alignment measurement, and supplying the imprint material onto the first shot region at the supply position, wherein the contacting step is started after moving the first shot region from the supply position to the imprint position based on both the global alignment information and the measured local first relative positional shift.

4. The method according to claim 3, wherein in the supplying step, the imprint material is successively supplied to at least two shot regions before the contacting step.

5. The method according to claim 3, wherein in the supplying step, the imprint material is successively supplied to at least two shot regions for every other shot region before the contacting step.

6. The method according to claim 1, further comprising performing a global alignment measurement for measuring a position of a sample shot region among the plurality of shot regions using an off-axis measurement device to acquire the global alignment information,
wherein the pre-alignment measurement includes:
determining a second measurement position at which the measurement device performs measurement of the second shot region when the sample shot region is located at a first measurement position at which the off-axis measurement device performs measurement in the global alignment measurement;
moving the second shot region to the second measurement position after the measurement of the sample shot region by the off-axis measurement device; and
measuring the local first relative positional shift between the second shot region and the mold using the measurement device.

7. The method according to claim 1, further comprising:
in a case where the first shot region is a peripheral shot region:
moving, based on the acquired global alignment information, the second shot region, which is a non-peripheral shot region, to the measurement position at which the measurement device performs the pre-alignment measurement, and measuring the local first relative positional shift between the second shot region and the mold using the measurement device; and
moving, based on the global alignment information and the measured local first relative positional shift, the first shot region to the imprint position at which the imprint process is performed before starting the contacting step; and
in a case where the first shot region is a non-peripheral shot region:
moving, based on the acquired global alignment information, the first shot region to the measurement position at which the measurement device performs the pre-alignment measurement, and measuring a local second relative positional shift between the first shot region and the mold using the measurement device; and
moving, based on the global alignment information and the measured local second relative positional shift, the first shot region to the imprint position at which the imprint process is performed before starting the contacting step.

8. An article manufacturing method comprising:
forming a pattern on a substrate using an imprint method defined in claim 1; and
processing the substrate on which the pattern has been formed,
wherein an article is manufactured from the processed substrate.

* * * * *